United States Patent
Jeon et al.

(10) Patent No.: US 11,996,396 B2
(45) Date of Patent: May 28, 2024

(54) DISPLAY DEVICE

(71) Applicant: Samsung Display Co., LTD., Yongin-si (KR)

(72) Inventors: Hyung Il Jeon, Yongin-si (KR); Min Woo Kim, Yongin-si (KR); Dae Ho Song, Yongin-si (KR); Byung Choon Yang, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 121 days.

(21) Appl. No.: 17/315,946

(22) Filed: May 10, 2021

(65) Prior Publication Data
US 2022/0037301 A1 Feb. 3, 2022

(30) Foreign Application Priority Data
Aug. 3, 2020 (KR) .......................... 10-2020-0096922

(51) Int. Cl.
*H01L 25/16* (2023.01)
*H01L 27/12* (2006.01)

(52) U.S. Cl.
CPC .......... *H01L 25/167* (2013.01); *H01L 27/124* (2013.01)

(58) Field of Classification Search
CPC ....................................................... G09F 9/302
See application file for complete search history.

(56) References Cited

U.S. PATENT DOCUMENTS

| | | | |
|---|---|---|---|
| 8,987,765 B2 | 3/2015 | Bibl et al. | |
| 9,029,880 B2 | 5/2015 | Sakariya et al. | |
| 9,111,464 B2 | 8/2015 | Bibl et al. | |
| 9,240,397 B2 | 1/2016 | Bibl et al. | |
| 9,343,448 B2 | 5/2016 | Sakariya et al. | |
| 9,958,957 B2 | 5/2018 | Yun et al. | |
| 10,529,789 B2 | 1/2020 | Kim et al. | |
| 2002/0158835 A1* | 10/2002 | Kobayashi | H10K 50/818 345/100 |
| 2007/0176554 A1* | 8/2007 | Kwak | H10K 50/865 313/512 |
| 2012/0256666 A1* | 10/2012 | Yuan | H03L 7/0812 327/158 |
| 2012/0256886 A1* | 10/2012 | Ryu | G06F 3/041 345/204 |

(Continued)

FOREIGN PATENT DOCUMENTS

| CN | 106647069 | * | 5/2017 | ........... G02F 1/1333 |
|---|---|---|---|---|
| CN | 106647069 | * | 10/2017 | ........... G02F 1/1333 |

(Continued)

*Primary Examiner* — Sang V Nguyen
(74) *Attorney, Agent, or Firm* — KILE PARK REED & HOUTTEMAN PLLC

(57) ABSTRACT

A display device includes a display panel including a first area and a second area spaced apart from the first area in a plan view. The display panel includes a first base layer including a first pixel, a second base layer facing the first base layer and including a second pixel, a first signal line electrically connected to the first pixel of the first area, a second signal line electrically connected to the second pixel of the second area, and a connection line electrically connecting the first signal line and the second signal line.

23 Claims, 12 Drawing Sheets

(56) References Cited

U.S. PATENT DOCUMENTS

| | | | | |
|---|---|---|---|---|
| 2015/0279914 A1* | 10/2015 | Qin | .................. | G02F 1/1368 |
| | | | | 257/386 |
| 2015/0364102 A1* | 12/2015 | Oh | .................. | H10K 59/1213 |
| | | | | 345/206 |
| 2016/0329025 A1* | 11/2016 | Park | .................. | G09G 3/3688 |
| 2017/0033171 A1* | 2/2017 | Kim | .................. | G09G 3/3233 |
| 2017/0123557 A1* | 5/2017 | Na | .................. | G06F 3/04166 |
| 2019/0081122 A1* | 3/2019 | Kim | .................. | H10K 59/38 |
| 2019/0206897 A1* | 7/2019 | He | .................. | H01L 27/124 |
| 2020/0314513 A1* | 10/2020 | Park | .................. | H04R 31/006 |
| 2021/0032156 A1* | 2/2021 | Hwang | .................. | H10K 50/86 |

FOREIGN PATENT DOCUMENTS

| | | | | |
|---|---|---|---|---|
| CN | 111261795 | * | 6/2020 | ........... H01L 51/504 |
| CN | 111736393 | * | 10/2020 | ........... G02F 1/1368 |
| KR | 10-1793628 | | 11/2017 | |
| KR | 10-2018-0078793 | | 7/2018 | |
| KR | 10-2019-0010298 | | 1/2019 | |
| KR | 10-2019-0029837 | | 3/2019 | |

\* cited by examiner

DISPLAY DEVICE

CROSS-REFERENCE TO RELATED APPLICATION(S)

This application claims priority to and benefits of Korean Patent Application No. 10-2020-0096922 under 35 U.S.C. § 119, filed on Aug. 3, 2020 in the Korean Intellectual Property Office, the entire contents of which are incorporated herein by reference.

BACKGROUND

1. Technical Field

The disclosure relates to a display device.

2. Description of the Related Art

In recent years, there has been increased interest in information display. Accordingly, research and development are being continuously conducted for a display device.

SUMMARY

The disclosure provides a both-sided transparent display device.

The disclosure is not limited to the above, and other technical objects which are not described will be clearly understood by those skilled in the art from the following description.

A display device according to an embodiment may include a display panel including a first area, and a second area spaced apart from the first area in a plan view. The display panel may include a first base layer including a first pixel, a second base layer facing the first base layer and including a second pixel, a first signal line electrically connected to the first pixel of the first area, a second signal line electrically connected to the second pixel of the second area, and a connection line electrically connecting the first signal line and the second signal line.

The connection line may extend in a first direction, and the first signal line and the second signal line may extend in a second direction intersecting the first direction.

The first area and the second area may be symmetrical on the display panel.

The connection line may be disposed between the first signal line and the second signal line in a cross-sectional view.

An end of the connection line may electrically contact the first signal line in the first area, and another end of the connection line may electrically contact the second signal line in the second area.

The first pixel may include a first light emitting element disposed on the first base layer, and the second pixel may include a second light emitting element disposed on the second base layer.

The display device may further include a first common electrode disposed between the first light emitting element and the first signal line.

A side of the first light emitting element may be electrically connected to the first signal line, and another side of the first light emitting element may be electrically connected to the first common electrode.

The first light emitting element may be electrically connected to the first signal line through a contact hole passing through the first common electrode.

The display device may further include a second common electrode disposed between the second light emitting element and the second signal line.

A side of the second light emitting element may be electrically connected to the second signal line, and another side of the second light emitting element may be electrically connected to the second common electrode.

The second signal line may be electrically connected to the second light emitting element through a contact hole passing through the second common electrode.

A surface of the first light emitting element may be covered by the first base layer, and a surface of the second light emitting element may be covered by the second base layer.

The display device may further include a light blocking layer disposed between the first light emitting element and the second light emitting element.

The display device may further include an opening area that may not overlap the first pixel and the second pixel.

The first base layer may contact the second base layer in the opening area.

The display device may further include a light blocking layer that may not overlap the opening area.

The light blocking layer may include a first light blocking layer disposed on the first base layer, and a second light blocking layer disposed on the second base layer.

The display device may further include a first pad portion disposed on the first base layer, and a second pad portion disposed on the second base layer. The first pad portion may be electrically connected to the first signal line, and the second pad portion may be electrically connected to the second signal line.

The display device may further include a first pad portion and a second pad portion disposed on the first base layer. The first pad portion may be electrically connected to the first signal line, and the second pad portion may be electrically connected to the second signal line.

Details of other embodiments are included in the detailed description and drawings.

According to an embodiment of the disclosure, the first pixel and the second pixel disposed at symmetrical positions on a first display surface (or a front surface) and a second display surface (or a rear surface) of the display device may be simultaneously driven. Accordingly, a both-sided display panel may be capable of displaying a same screen in which the left and right are not reversed on the first display surface and the second display surface, for example, on both sides. Opening areas that may serve as a transmission window may be disposed in a display area, and thus a transparent display device may be implemented.

The embodiments are not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
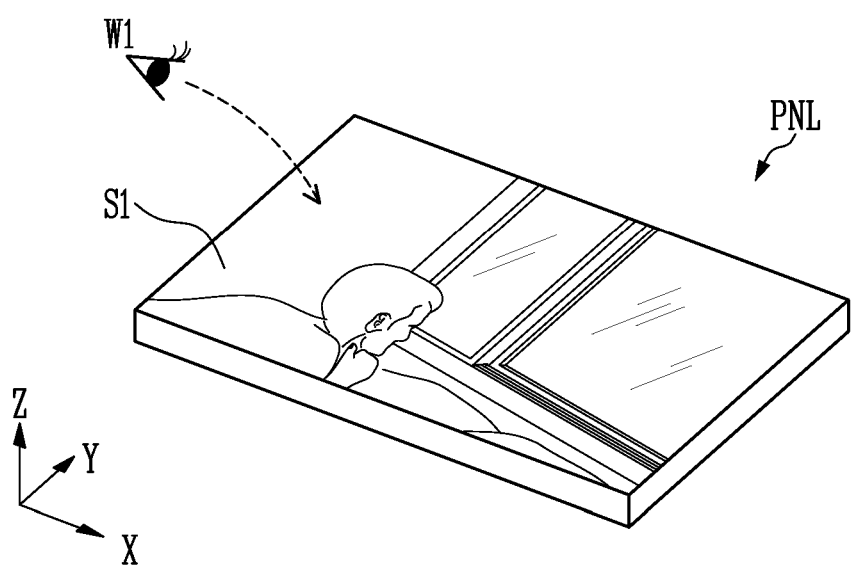
FIGS. 1 to 3 are perspective views of a display device according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure. The disclosure is only defined by the scope of the claims.

The terms used in the specification are for describing embodiments and are not intended to limit the disclosure. The same reference numbers indicate the same components throughout the specification. In the attached figures, the thickness of layers and regions may be exaggerated for clarity and convenience of explanation. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

In the description, it will be understood that when an element (a region, a layer, a section, or the like) is referred to as being "on", "connected to" or "coupled to" another element, it can be directly on, connected or coupled to the other element, or one or more intervening elements may be disposed therebetween.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The term "does/do not overlap" may include "apart from" or "set aside from" or "offset from" and any other suitable equivalents as would be appreciated and understood by those of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure are described in detail with reference to the accompanying drawings.

Figure 2:
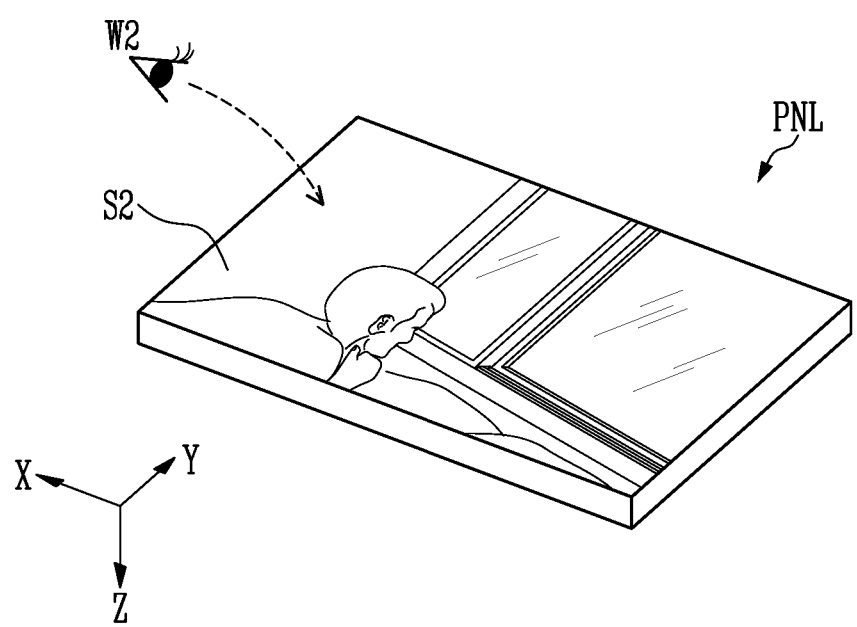
Figure 3:
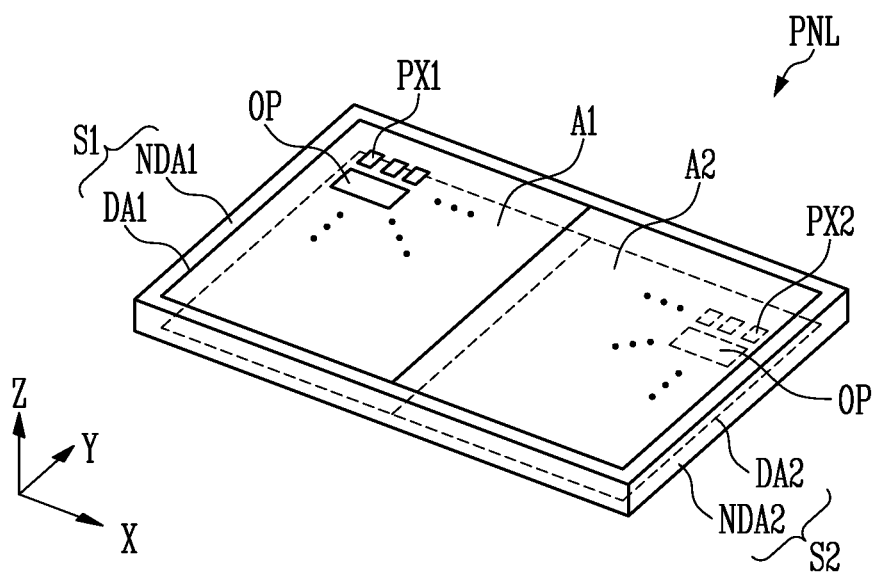

FIGS. 1 to 3 are perspective views of a display device according to an embodiment.

FIG. 1 illustrates a front surface of the display device, FIG. 2 illustrates a rear surface of the display device, and FIG. 3 illustrates both of the front surface and the rear surface of the display device. FIGS. 1 to 3 illustrate a display panel PNL included in the display device.

Referring to FIGS. 1 and 2, the display panel PNL is a both-sided display panel, and may include a first display surface S1 and a second display surface S2.

The first display surface S1 may be positioned on a surface (for example, a front surface based on FIG. 1) of the display panel PNL, and may provide an image to a first user W1 looking at the surface (or the front surface) of the display panel PNL.

The second display surface S2 may be positioned on another surface (for example, a rear surface based on FIG. 2) of the display panel PNL, and may provide an image to a second user W2 looking at the other surface (or the rear surface) of the display panel PNL.

When the display panel PNL is operated, the first display surface S1 and the second display surface S2 may simultaneously display the image. For example, the first display surface S1 and the second display surface S2 may display substantially a same image. For example, image displayed on the first display surface S1 and visually recognized by the first user W1 and the image displayed on the second display surface S2 and visually recognized by the second user W2 may be a same screen in which the left and right are not reversed.

FIGS. 1 and 2 illustrate a case where the first display surface S1 and the second display surface S2 are parallel to each other and face in opposite directions, but embodiments are not limited thereto. For example, the first display surface S1 and the second display surface S2 may face different directions, and may form a predetermined angle. According to an embodiment, the display panel PNL may further include a third display surface and may further include additional display surfaces positioned between the first display surface S1 and the second display surface S2.

Referring to FIG. 3, each of the display surfaces S1 and S2 may include a display area DA and a non-display area NDA.

The first display surface S1 may include a first display area DA1 corresponding to a front display area and a first non-display area NDA1 that does not include the first display area DA1. According to an embodiment, the first display area DA1 may be disposed at a center of the first display surface S1, and the first non-display area NDA1 may be disposed along an edge of the display panel PNL to surround the first display area DA1.

The second display surface S2 may include a second display area DA2 corresponding to a rear display area and a second non-display area NDA2 that does not include the second display area DA2. According to an embodiment, the second display area DA2 may be disposed at a center of the second display surface S2, and the second non-display area NDA2 may be disposed along an edge of the display panel PNL to surround the second display area DA2.

The first display area DA1 and the second display area DA2 may overlap in a third direction (for example, a Z-axis direction). The first non-display area NDA1 and the second non-display area NDA2 may overlap in the third direction (Z-axis direction). However, positions of the display area DA and the non-display area NDA are not necessarily limited thereto, and the positions thereof may be variously changed.

Pixels PX may be disposed in the display area DA, and various lines, pad portions, and/or circuit portions connected to the pixels PX may be disposed in the non-display area NDA. The pixels PX may include a first pixel PX1 defined in the first display area DA1 and a second pixel PX2 defined in the second display area DA2. The first and second pixels PX1 and PX2 may be regularly arranged according to a stripe or pentile arrangement structure in the first and second display areas DA1 and DA2, respectively. However, the arrangement structure of the pixels PX is not limited thereto, and the pixels PX may be arranged in the display area DA in various structures and/or methods.

Each of the pixels PX may be connected to at least one of a scan line, at least one of a data line, and a power line. Each of the pixels PX may include transistors and at least one capacitor. Each of the pixels PX may receive a data voltage of the data line when a scan signal is applied from the scan line, and may emit light by supplying a driving current to a light emitting diode according to the data voltage.

According to an embodiment, the pixels PX may emit light of different colors, respectively. For example, the pixels PX may include first color pixels emitting light of a first color, second color pixels emitting light of a second color, and third color pixels emitting light of a third color. At least one of the first to third color pixels disposed to be adjacent to each other may configure one pixel unit capable of emitting light of various colors. For example, each of the first to third color pixels may be a sub pixel that emits light of a predetermined color. According to an embodiment, the first color pixel may be a red pixel emitting red light, the second color pixel may be a green pixel emitting green light, and the third color pixel may be a blue pixel emitting blue light, but embodiments are not limited thereto.

In an embodiment, the first color pixel, the second color pixel, and the third color pixel may include a light emitting element of a first color, a light emitting element of a second color, and a light emitting element of a third color as light sources to emit light of the first color, the second color, and the third color, respectively. However, the disclosure is not limited thereto. According to an embodiment, the first color pixel, the second color pixel, and the third color pixel may include light emitting elements that emit light of the same color, and may include a color conversion layer and/or a color filter of different colors disposed on each light emitting element to emit light of the first color, the second color, and the third color, respectively.

The pixel PX may include at least one light source driven by a control signal (for example, a scan signal and a data signal) and/or a power (for example, first power and second power). In an embodiment, the light source may include ultra-small bar type light emitting elements LD of FIG. 6 having a size as small as nano scale to micro scale. However, the disclosure is not limited thereto, and various types of light emitting elements may be used as the light source of the pixel PX.

The display panel PNL may further include opening areas OP disposed in the first and second display areas DA1 and DA2. The opening area OP may be disposed around the pixels PX that they may not overlap the first pixel PX1 and the second pixel PX2. Accordingly, the opening area OP may serve as a transmission window through which an object or a background positioned on one side of the display panel PNL may be visually recognized by a user on another side. The user may watch necessary information through the display panel PNL while watching the object or the background positioned behind the display panel PNL. For example, since a transparent display device may be implemented using the opening area OP, spatial and temporal limitations of the existing display device may be resolved. Detailed description of the opening area OP is described later with reference to FIG. 5 and the like.

In an embodiment, the display panel PNL may include a first area A1 and a second area A2 spaced apart from the first area A1 in a plan view. The first area A1 and the second area A2 may be symmetrical on the display panel PNL. For example, as shown in FIG. 4, the first area A1 and the second area A2 may be symmetrical with respect to a center line CENL disposed at a center of the display panel PNL.

The first pixels PX1 of the first area A1 may be driven simultaneously with the second pixels PX2 of the second area A2. Similarly, the first pixels PX1 of the second area A2 may be driven simultaneously with the second pixels PX2 of the first area A1. Accordingly, the display panel PNL may display a same screen in which the left and right are not reversed on the first display surface S1 and the second display surface S2. FIG. 4 is referenced for a detailed description of this embodiment.

Figure 4:
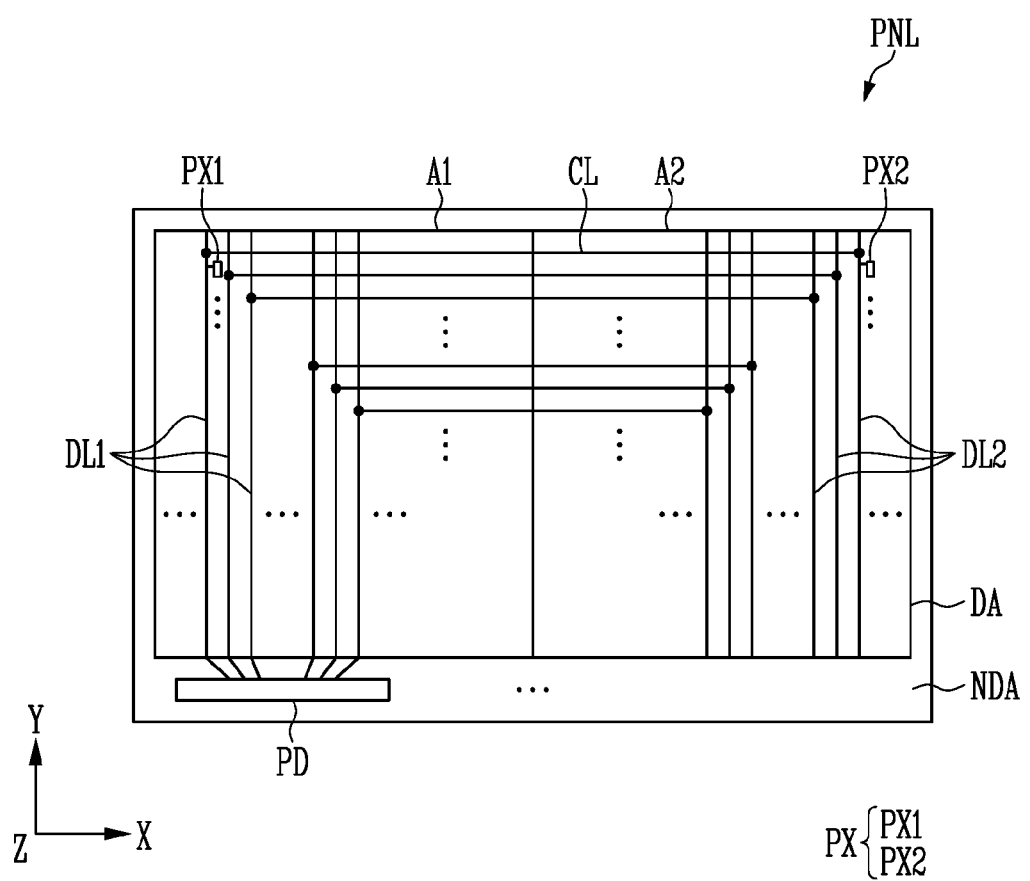
FIG. 4 is a plan view of the display device according to an embodiment.

FIG. 4 is a plan view of the display device according to an embodiment.

Referring to FIG. 4, the display panel PNL may include first signal lines DL1 electrically connected to first pixels PX1, second signal lines DL2 electrically connected to second pixels PX2, and a connection line CL electrically connecting the first signal lines DL1 and the second signal lines DL2 to each other.

The first signal lines DL1 and the second signal lines DL2 may each extend along a second direction (for example, a Y-axis direction) in the display area DA and may be sequentially arranged along a first direction (for example, an X-axis direction). The first signal lines DL1 may extend from the non-display area NDA and may be disposed in the display area DA. An end of the first signal lines DL1 may be electrically connected to a pad portion PD disposed in the non-display area NDA.

The pad portion PD may provide a driving signal output from a driver (not shown) to the pixel PX. For example, the driver may generate a data signal that determines an emission luminance of the pixel PX. The pad portion PD may provide the data signal to the first pixel PX1 through a first signal line DL1. The first signal line DL1 may be electrically connected to a second signal line DL2 through the connection line CL to provide the data signal to the second pixel PX2. For example, the first signal line DL1 and the second signal line DL2 may be data lines transferring the data signal to the pixels PX.

Hereinafter, for convenience of description, description is given based on the signal line electrically connected to the first pixel PX1 of the first area A1 and the second pixel PX2 of the second area A2 that are symmetrical to each other.

Each of the connection lines CL may extend in the first direction (for example, an X-axis direction) over the first area A1 and the second area A2 and may be sequentially arranged in the second direction (for example, a Y-axis direction). An end of the connection line CL may be electrically connected to the first signal line DL1 in the first area A1, and another end of the connection line CL may be electrically connected to the second signal line DL2 in the second area A2. Accordingly, the first pixel PX1 of the first area A1 electrically connected to the first signal line DL1 and the second pixel PX2 of the second area A2 electrically connected to the second signal line DL2 may be simultaneously driven. Therefore, the display panel PNL may display a same screen in which the left and right are not reversed on the first display surface S1 and the second display surface S2, for example, on both surfaces of the display device.

Figure 5:
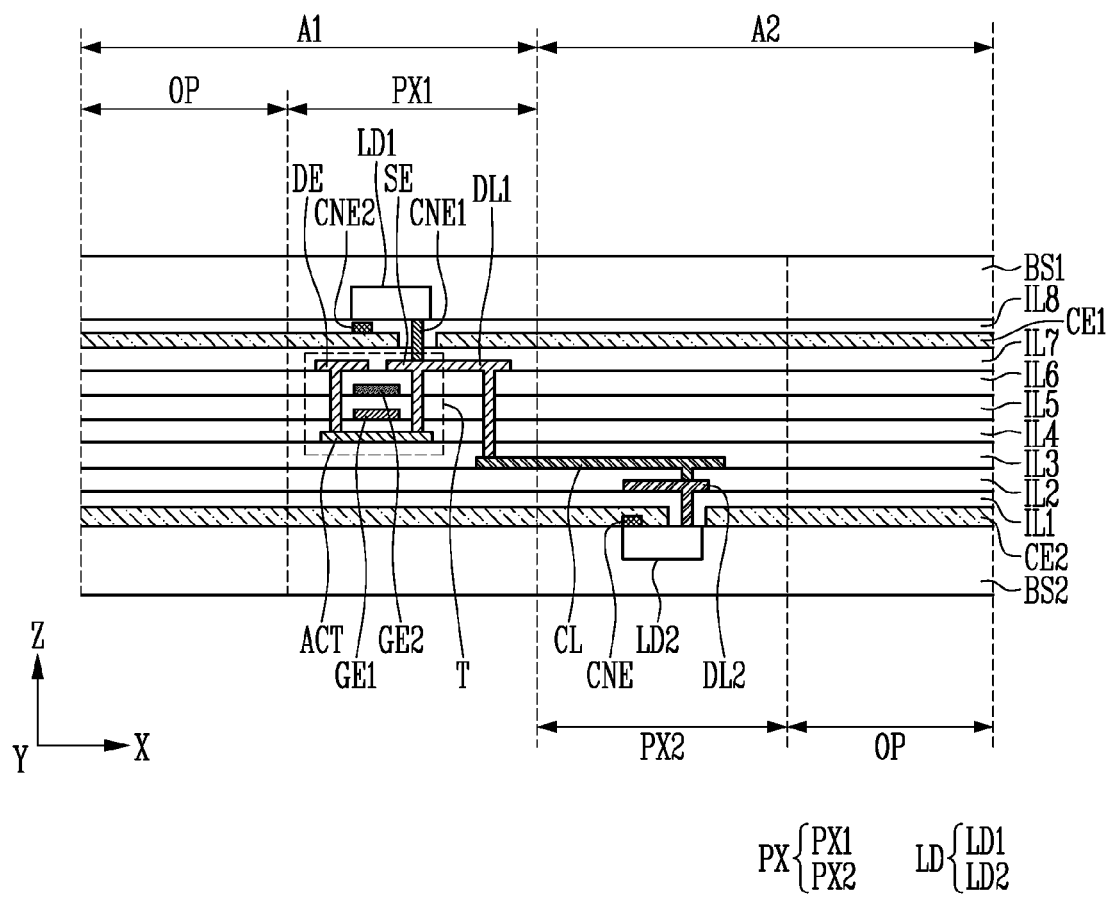
FIG. 5 is a schematic cross-sectional view of the display device according to an embodiment.

FIG. 5 is a schematic cross-sectional view of the display device according to an embodiment.

In FIG. 5, for convenience of description, only the second pixel PX2 of the second area A2 which is symmetrical and electrically connected to the first pixel PX1 of the first area A1 is shown. However, the disclosure is not limited thereto, and in addition to the first pixel PX1 and the second pixel PX2 shown in FIG. 5, separately driven pixels may be further disposed. For example, the second pixel PX2 overlapping the first pixel PX1 in the third direction (for example, a Z-axis direction) in the first area A1 or the first pixel PX1 overlapping the second pixel PX2 in the third direction (Z-axis direction) in the second area A2 may be further included.

Referring to FIG. 5, the display device may include a first base layer BS1 and a second base layer BS2 facing the first base layer BS1.

The first base layer BS1 may include the first pixel PX1 as a front surface pixel, and the second base layer BS2 may include the second pixel PX2 as a rear surface pixel. The first base layer BS1 may be disposed on the first display surface S1 of FIG. 3, or the like, and the second base layer BS2 may be disposed on the second display surface S2 of FIG. 3.

The first and second base layers BS1 and BS2 may be formed of a flexible material capable of bending, folding, rolling, and the like. For example, the first and second base layers BS1 and BS2 may include at least one of polyimide (PI), polyethersulphone (PES), polyacrylate (PA), polyarylate (PAR), polyetherimide (PEI), polyethylenenapthalate (PEN), polyethyleneterepthalate (PET), polyphenylenesulfide (PPS), polyallylate, polycarbonate (PC), cellulose triacetate (CAT), or cellulose acetate propionate (CAP), but is not limited thereto. According to an embodiment, the display device may further include a substrate disposed outside the first and second base layers BS1 and BS2. The substrate may be a glass substrate as a rigid substrate, but is not limited thereto.

Between the first base layer BS1 and the second base layer BS2, light emitting elements LD disposed in each pixel PX and transistors T as circuit elements for driving the light emitting elements LD may be included. In FIG. 5, for convenience of description, one transistor T connected to a first light emitting element LD1 is shown. However, according to an embodiment, a storage capacitor and/or a power line, which are not shown, may be further disposed in the display panel PNL.

Figure 6:
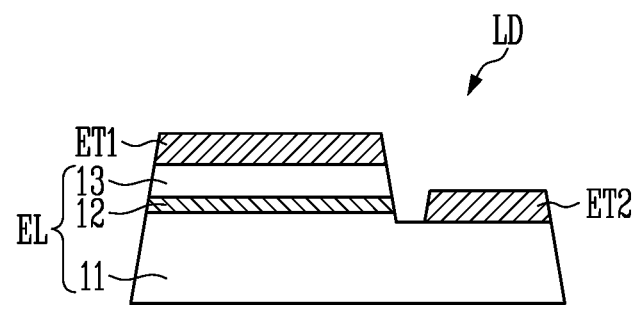
FIG. 6 is a schematic cross-sectional view illustrating a light emitting element according to an embodiment.

The first pixel PX1 may include a first light emitting element LD1 disposed on the first base layer BS1. The second pixel PX2 may include a second light emitting element LD2 disposed on the second base layer BS2. Hereinafter, when at least one of the first light emitting element LD1 and the second light emitting element LD2 is singularly or collectively referred to, the at least one of the first light emitting element LD1 and the second light emitting element LD2 is referred to as a "light emitting element LD" or "light emitting elements LD". The light emitting elements LD may have substantially the same structure. FIG. 6 is referenced for detailed description of the light emitting element LD.

FIG. 6 is a schematic cross-sectional view illustrating the light emitting element according to an embodiment.

Referring to FIG. 6, the light emitting element LD may include a first electrode ET1, a second electrode ET2, and an emission layer EL. The first electrode ET1 and/or the second electrode ET2 of the light emitting element LD may be electrically connected to a circuit element such as the transistors T and may emit light by a control signal (for example, a scan signal and a data signal) and/or power (for example, first power and second power). For example, when a voltage equal to or greater than a threshold voltage is applied to both ends of the light emitting element LD, electron-hole pairs may be coupled in an active layer 12 of the emission layer EL, and thus the light emitting element LD emits light. By controlling the emission of the light emitting element LD using this principle, the light emitting element LD may be used as a light source of the display device.

The emission layer EL may include a first semiconductor layer 11, a second semiconductor layer 13, and the active layer 12 disposed between the first semiconductor layer 11 and the second semiconductor layer 13.

The first semiconductor layer 11 may be a semiconductor layer of a first conductivity type. For example, the first semiconductor layer 11 may include an N-type semiconductor layer. For example, the first semiconductor layer 11 may include any one of InAlGaN, GaN, AlGaN, InGaN, AlN, and InN, and may be an N-type semiconductor layer doped with a first conductivity type dopant such as Si, Ge, and Sn. However, the material configuring the first semiconductor layer 11 is not limited thereto, and in addition to the above-described materials, various materials may configure the first semiconductor layer 11.

The active layer 12 may be disposed on the first semiconductor layer 11 and may be formed in a single quantum well structure or a multi-quantum well structure.

The second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductivity type dopant such as Mg. However, the material configuring the second semiconductor layer 13 is not limited thereto, and in addition to the above-described materials, various materials may configure the second semiconductor layer 13.

The first electrode ET1 may be disposed on the second semiconductor layer 13. The first electrode ET1 may function as an anode terminal.

The second electrode ET2 may be disposed on the first semiconductor layer 11. The above-described active layer 12 and second semiconductor layer 13 may be disposed on a side of the first semiconductor layer 11, and the second electrode ET2 may be disposed on another side of the first semiconductor layer 11 to be electrically separated from the active layer 12 and the second semiconductor layer 13. The second electrode ET2 may function as a cathode terminal.

Each of the first electrode ET1 and/or the second electrode ET2 may be formed of a material including at least one of a metal material such as Au, W, Pt, Si, Ir, Ag, Cu, Ni, Ti, or Cr, and an alloy thereof. According to an embodiment, each of the first electrode ET1 and/or the second electrode ET2 may be formed of a transparent conductive material, and the transparent conductive material may include indium tin oxide (ITO), indium zinc oxide (IZO), or the like, but is not limited thereto.

The light emitting element LD may be mounted in each of the pixels PX and may be used as the light source of the display device. In an embodiment, the light emitting element LD may be a micro light emitting diode (micro LED) having a size of a micrometer (µm) unit. For example, a length of one side of the light emitting element LD may be 100 µm or less. When the micro LED is applied as the light source of the display device, since a wider aperture ratio may be secured compared to the existing light emitting diode, a space in which the opening area OP of FIG. 5 for implementing the transparent display device is disposed may be secured. However, the light emitting element LD applied to the embodiment is not limited thereto, and a structure and a size of the light emitting element LD may be variously changed according to a design condition of various devices using a light emitting device using the light emitting element LD as a light source, for example, a display device.

Referring to FIG. 5 again, the second light emitting element LD2 may be disposed on the second base layer BS2. The second light emitting element LD2 may be disposed in the second pixel PX2. The second light emitting element LD2 may be mounted in the second base layer BS2 and thus a lower surface and a side surface of the second light emitting element LD2 may be covered by the second base layer BS2. For example, when the second base layer BS2 is formed of a polymer film such as polyimide (PI), after coating an organic film for forming the second base layer BS2, the organic film may be cured after disposing the second light emitting element LD2 on the organic film. Accordingly, the lower surface and the side surface of the second light emitting element LD2 may be covered by the second base layer BS2 and thus the second light emitting element LD2 may be fixed. Since a separate process for bonding the second light emitting element LD2 may be omitted, process economy may be secured.

A second common electrode CE2 may be disposed on the second light emitting element LD2. The second common electrode CE2 may be disposed on the entire surface of the second base layer BS2. The second common electrode CE2 may be formed of a metal thin film having a small work function such as Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). The second common electrode CE2 may further include a transparent metal oxide layer disposed on a material layer having a small work function.

A contact electrode CNE may be further disposed between the second light emitting element LD2 and the second common electrode CE2. The second light emitting element LD2 may be electrically connected to the second common electrode CE2 through the contact electrode CNE. For example, the second common electrode CE2 may be electrically connected to the second electrode ET2 of FIG. 6 of the second light emitting element LD2. The contact electrode CNE may include a metal or a metal oxide. For example, the contact electrode CNE may include copper (Cu), chromium (Cr), titanium (Ti), aluminum (Al), gold (Au), nickel (Ni), indium tin oxide (ITO), an oxide or an alloy thereof, or the like, but is not limited thereto.

A first insulating layer IL1 may be disposed on the second common electrode CE2. The first insulating layer IL1 may be disposed on the entire surface of the second base layer BS2. The first insulating layer IL1 may be configured of a single layer or multiple layers, and may include at least one inorganic insulating material and/or an organic insulating material. For example, the first insulating layer IL1 may include various types of organic/inorganic insulating materials such as silicon nitride (SiNx) or silicon oxide (SiOx).

The second signal line DL2 described above may be disposed on the first insulating layer IL1. The second signal line DL2 may be electrically connected to the second light emitting element LD2 through a contact hole passing through the second common electrode CE2 and/or the first insulating layer IL1. For example, the second signal line DL2 may be electrically connected to the first electrode ET1 of FIG. 6 of the second light emitting element LD2. The second signal line DL2 and the second common electrode CE2 may be insulated by the first insulating layer IL1.

The second signal line DL2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

According to an embodiment, the second signal line DL2 may function as a reflective member. For example, the second signal line DL2 may include a reflective conductive material and may overlap the second light emitting element LD2 in the third direction (for example, a Z-axis direction). Even though light emitted from the second light emitting element LD2 proceeds inside the display panel PNL, the light may be reflected by the second signal line DL2 and may be emitted in a light emission direction (for example, a direction opposite to the third direction (Z-axis direction) of the second pixel PX2. For example, light loss may be minimized to improve light emission efficiency.

A second insulating layer IL2 may be disposed on the second signal line DL2. The second insulating layer IL2 may be disposed on the entire surface of the second base layer BS2. The second insulating layer IL2 may be configured as a single layer or multiple layers, and may include at least one inorganic insulating material and/or an organic insulating material. For example, the second insulating layer IL2 may include various types of organic/inorganic insulating materials, such as silicon nitride (SiNx) or silicon oxide (SiOx).

The above-described connection line CL may be disposed on the second insulating layer IL2. The connection line CL may extend along the first direction (for example, an X-axis direction) over the first area A1 and the second area A2. For example, an end of the connection line CL may be disposed in the first area A1, and another end of the connection line CL may be disposed in the second area A2. The end of the connection line CL may electrically contact the first signal line DL1 described above in the first area A1, and the another end of the connection line CL may electrically contact the second signal line DL2 described above in the second area. The another end of the connection line CL may be electrically connected to the second signal line DL2 through a contact hole passing through the second insulating layer IL2.

A third insulating layer IL3 may be disposed on the connection line CL. The third insulating layer IL3 may be disposed on the entire surface of the second base layer BS2. The third insulating layer IL3 may be configured as a single layer or multiple layers, and may include at least one inorganic insulating material and/or an organic insulating material. For example, the third insulating layer IL3 may include various types of organic/inorganic insulating materials such as silicon nitride (SiNx) or silicon oxide (SiOx).

A semiconductor pattern ACT may be disposed on the third insulating layer IL3. The semiconductor pattern ACT may include a first region that contacts each source electrode SE, a second region that contacts each drain electrode DE, and a channel region positioned between the first and second regions. According to an embodiment, the semiconductor pattern ACT may be a semiconductor pattern formed of polysilicon, amorphous silicon, oxide semiconductor, or the like. The channel region of the semiconductor pattern ACT may be an intrinsic semiconductor as a semiconductor pattern that is not doped with an impurity, and each of the first and second regions of the semiconductor pattern ACT may be a semiconductor pattern doped with an impurity.

In an embodiment, the semiconductor pattern ACT of each of the transistors T may be formed of substantially a same or similar material. For example, the semiconductor pattern ACT of each of the transistors T may be formed of a same material among polysilicon, amorphous silicon, and oxide semiconductor. In another embodiment, some of the transistors T and the others of the transistors T may include the semiconductor pattern ACT formed of different materials. For example, the semiconductor pattern ACT of some of the transistors T may be formed of polysilicon or amorphous silicon, and the semiconductor pattern ACT of the other transistors among the transistors T may be formed of an oxide semiconductor.

A fourth insulating layer IL4 may be disposed on the semiconductor pattern ACT. The fourth insulating layer IL4 may be disposed on the entire surface of the second base layer BS2. The fourth insulating layer IL4 may be configured as a single layer or multiple layers, and may include at least one inorganic insulating material and/or an organic insulating material. For example, the fourth insulating layer IL4 may include various types of organic/inorganic insulating materials, such as silicon nitride (SiNx) or silicon oxide (SiOx).

A first gate electrode GE1 and a second gate electrode GE2 of the transistor T may be disposed on the fourth insulating layer IL4. The fourth insulating layer IL4 may be interposed between the first gate electrode GE1 and the semiconductor pattern ACT, and the fourth insulating layer IL4 may overlap the semiconductor pattern ACT. A fifth insulating layer IL5 may be interposed between the second gate electrode GE2 and the first gate electrode GE1, and the fifth insulating layer IL5 may overlap the first gate electrode GE1. The first gate electrode GE1 and the second gate electrode GE2 may be formed of a same material, but are not limited thereto. The first gate electrode GE1 and/or the second gate electrode GE2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

A sixth insulating layer IL6 may be disposed on the second gate electrode GE2. The sixth insulating layer IL6 may be configured as a single layer or multiple layers, and may include at least one inorganic insulating material and/or an organic insulating material. For example, the sixth insulating layer IL6 may include various types of organic/inorganic insulating materials, such as silicon nitride (SiNx) or silicon oxide (SiOx).

The above-described first signal line DL1 and the source electrode SE and the drain electrode DE of the transistor T may be disposed on the sixth insulating layer IL6.

The first signal line DL1 may be electrically connected to an end of the connection line CL through a contact hole passing through the third to sixth insulating layers IL3, IL4, IL5, and IL6. According to an embodiment, the first signal line DL1 may be integrally formed with the source electrode SE. Accordingly, the data signal transferred through the transistor T may be transferred to the first signal line DL1 and supplied to the second signal line DL2 through the connection line CL. Accordingly, the first pixel PX1 of the first area A1 electrically connected to the first signal line DL1 and the second pixel PX2 of the second area A2 electrically connected to the second signal line DL2 may be simultaneously driven. Therefore, the display panel PNL may display a same screen in which the left and right are not reversed on the first display surface S1 of FIG. 3 or the like and the second display surface S2 of FIG. 3 or the like as described above.

The source electrode SE may overlap one region (for example, the source region of the transistor T) of the semiconductor pattern ACT and may contact the region of the semiconductor pattern ACT through a contact hole passing through the fourth to sixth insulating layers IL4, IL5, and IL6.

The drain electrode DE may overlap the another region (for example, the drain region of the transistor T) of the semiconductor pattern ACT and may contact the another region through a contact hole passing through the fourth to sixth insulating layers IL4, IL5, and IL6.

The first signal line DL1, the source electrode SE, and the drain electrode DE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

According to an embodiment, the first signal line DL1, the source electrode SE, and/or the drain electrode DE may function as a reflective member. For example, the first signal line DL1, the source electrode SE, and/or the drain electrode DE may include a reflective conductive material and may overlap the first light emitting element LD1 in the third direction (for example, a Z-axis direction). Even though light emitted from the first light emitting element LD1 proceeds inside the display panel PNL, the light may be reflected by the first signal line DL1, the source electrode SE, and/or the drain electrode DE and may be emitted in a light emission direction (for example, the third direction (Z-axis direction) of the first pixel PX1. For example, light loss may be minimized to improve light emission efficiency.

A seventh insulating layer IL7 may be disposed on the first signal line DL1, the source electrode SE, and/or the drain electrode DE. The seventh insulating layer IL7 may be configured as a single layer or multiple layers, and may include at least one inorganic insulating material and/or an organic insulating material. For example, the seventh insulating layer IL7 may include various types of organic/inorganic insulating materials such as silicon nitride (SiNx) or silicon oxide (SiOx).

A first common electrode CE1 may be disposed on the seventh insulating layer IL7. The first common electrode CE1 may be disposed on the entire surface of the second base layer BS2. The first common electrode CE1 may be formed of a metal thin film having a small work function such as Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). The first common electrode CE1 may further include a transparent metal oxide layer disposed on a material layer having a small work function.

The first light emitting element LD1 may be disposed on the first common electrode CE1. The first light emitting element LD1 may be disposed on the first pixel PX1. An eighth insulating layer IL8 may be additionally disposed between the first common electrode CE1 and the first light emitting element LD1. The eighth insulating layer IL8 may be disposed on the entire surface of the second base layer BS2. The eighth insulating layer IL8 may be configured as a single layer or multiple layers, and may include at least one inorganic insulating material and/or an organic insulating material. For example, the eighth insulating layer IL8 may include various types of organic/inorganic insulating materials, such as silicon nitride (SiNx) or silicon oxide (SiOx).

An end of the first light emitting element LD1 may be electrically connected to the first signal line DL1 through a first contact electrode CNE1, and another end of the first light emitting element LD1 may be electrically connected to the first common electrode CE1 through a second contact electrode CNE2. In an embodiment, the first contact electrode CNE1 may contact the source electrode SE (or the first signal line DL1) described above through a contact hole passing through the eighth insulating layer IL8, the first common electrode CE1, and the seventh insulating layer IL7. The first contact electrode CNE1 and the first common electrode CE1 may be insulated by the eighth insulating layer IL8. For example, the source electrode SE (or the first signal line DL1) may be electrically connected to the first electrode ET1 of FIG. 6 of the first light emitting element LD1 by the first contact electrode CNE1. The second contact electrode CNE2 may contact the first common electrode CE1 through a contact hole passing through the eighth insulating layer IL8. For example, the first common electrode CE1 may be electrically connected to the second electrode ET2 of FIG. 6 of the first light emitting element LD1 through the second contact electrode CNE2.

The first and second contact electrodes CNE1 and CNE2 may include metal or a metal oxide. For example, the first and second contact electrodes CNE1 and CNE2 may include metal or a metal oxide. For example, the first and second contact electrodes CNE1 and CNE2 may include copper (Cu), chromium (Cr), titanium (Ti), aluminum (Al), gold (Au), nickel (Ni), indium tin oxide (ITO), an oxide or an alloy thereof, or the like, but are not limited thereto. Materials included in each of the first and second contact electrodes CNE1 and CNE2 may be the same or different from each other.

The first base layer BS1 may be disposed on the first light emitting element LD1. An upper surface and a side surface of the first light emitting element LD1 may be covered by the first base layer BS1. For example, when the first base layer BS1 is formed of a polymer film such as polyimide (PI), after coating an organic film for forming the first base layer BS1, the organic film may be cured after coating the organic film for forming the first base layer BS1. Accordingly, the upper surface and the side surface of the first light emitting element LD1 may be covered by the first base layer BS1 and thus the first light emitting element LD1 may be fixed. Since a separate process for bonding the first light emitting element LD1 may be omitted, process economy may be secured.

The display panel PNL may further include opening areas OP. The opening area OP may be disposed around the pixels PX to non-overlap the first pixel PX1 and the second pixel PX2. For example, the opening area OP may be disposed so that they may not overlap the first light emitting element LD1 and the second light emitting element LD2. The opening area OP may be disposed so that it may not overlap the above-described transistor T, the signal lines DL1 and DL2, and the like. Since the opening area OP may serve as a transmission window through which an object or a background positioned on one side of the display panel PNL may be visually recognized by a user on another side, a transparent display device may be easily implemented as described above.

According to the display device according to an embodiment described above, the first pixel PX1 and the second pixel PX2 respectively disposed at symmetrical positions on the first display surface S1 (or the front surface) and the second display surface S2 (or the rear surface) of the display device may be simultaneously driven by the connection line CL. Accordingly, the both-sided display panel PNL capable of displaying a same screen in which the left and right are not reversed on the first display surface S1 and the second display surface S2 of the display panel PNL may be implemented. Since the opening areas OP that may serve as a transmission window are disposed in the display area DA, a transparent display device may be easily implemented.

Hereinafter, another embodiment is described. In the following embodiment, the same component as that previously described is referred to by the same reference numeral, and repetitive descriptions are omitted or simplified.

Figure 7:
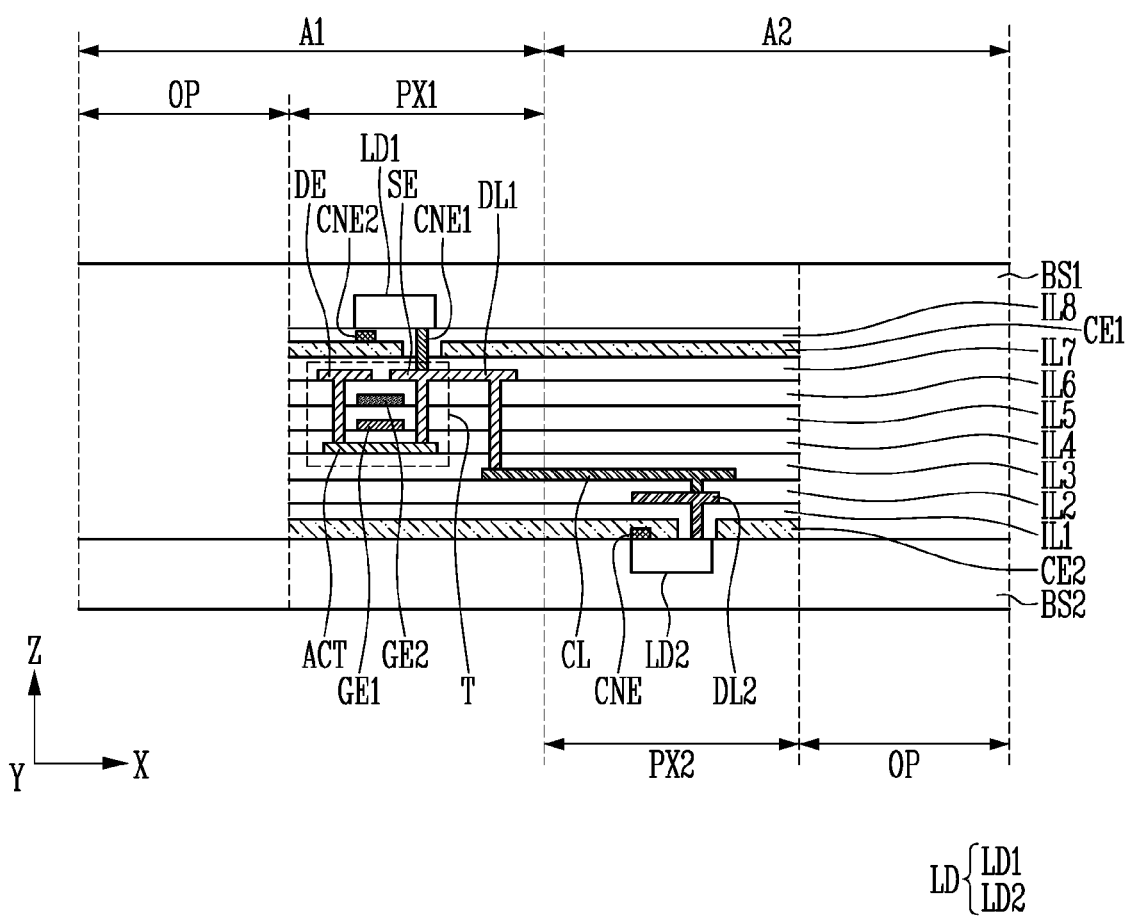
FIG. 7 is a schematic cross-sectional view of a display device according to another embodiment.

FIG. 7 is a schematic cross-sectional view of a display device according to another embodiment.

Referring to FIG. 7, the display device according to the embodiment is different from the embodiment of FIGS. 1 to 6 in that conductive layers and/or insulating layers are omitted from the opening area OP. In FIG. 7, for convenience of description, only the second pixel PX2 of the second area A2 which is symmetrical and electrically connected to the first pixel PX1 of the first area A1 is shown. However, separately driven pixels may be further disposed as described above. In order to secure a transmittance of the opening area OP, conductive layers and/or insulating layers may be omitted from the opening area OP. For example, the conductive layer configuring the transistor T, the signal lines DL1 and DL2, the common electrodes CE1 and CE2, and the like, and the insulating layers IL1 to IL8 described above may be removed from the opening area OP. Accordingly, the transmittance of the opening area OP may be improved.

In an embodiment, when the conductive layers and/or insulating layers are omitted in the opening area OP, in a process of forming the second base layer BS2, the first base layer BS1 may be directly formed on the second base layer BS2. For example, the first base layer BS1 and the second base layer BS2 may contact each other in the opening area OP. For example, when the first base layer BS1 is formed of a polymer film such as polyimide (PI), an organic film for forming the first base layer BS1 is coated on the second base layer BS2 of the opening area OP from which the conductive layers and/or insulating layers are omitted, and the organic film may be cured. Accordingly, the first base layer BS1 and the second base layer BS2 may contact each other in the opening area OP.

The first pixel PX1 and the second pixel PX2 respectively disposed at symmetrical positions on the first display surface S1 (or the front surface) and the second display surface S2 (or the rear surface) of the display device may be simultaneously driven by the connection line CL, and thus the both-sided display panel PNL capable of displaying a same screen in which the left and right are not reversed may be implemented as described above.

Figure 8:
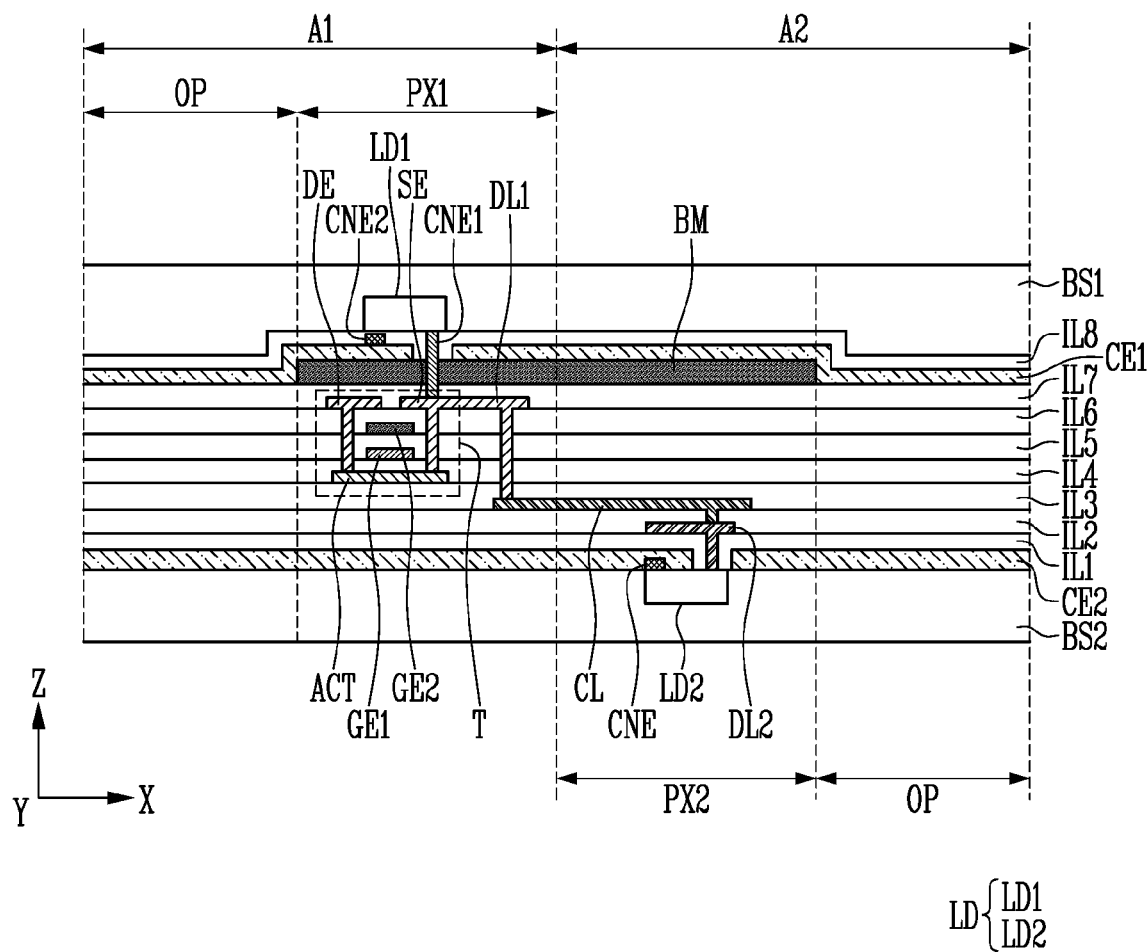
FIG. 8 is a schematic cross-sectional view of a display device according to yet another embodiment.

FIG. 8 is a schematic cross-sectional view of a display device according to still another embodiment.

Referring to FIG. 8, the display device according to the embodiment is different from the embodiment of FIGS. 1 to 6 in that the display device according to the embodiment further includes a light blocking layer BM. In FIG. 8, for convenience of description, only the second pixel PX2 of the second area A2 which is symmetrical and electrically connected to the first pixel PX1 of the first area A1 is shown. However, separately driven pixels may be further disposed as described above.

The light blocking layer BM may be disposed between the first light emitting element LD1 and the second light emitting element LD2. The light blocking layer BM may be disposed to overlap the first light emitting element LD1 and the second light emitting element LD2 in the third direction (for example, a Z-axis direction). Accordingly, the light emitted from the first light emitting element LD1 may be prevented from being emitted to the second display surface S2 (or the rear surface). The light emitted from the second light emitting element LD2 may be prevented from being emitted to the first display surface S1 (or the front surface). For example, even though a same screen in which the left and right are not reversed is displayed on the first display surface S1 (or the front surface) and the second display surface S2 (or the rear surface), interference between the images displayed on both the surfaces may be minimized.

According to an embodiment, the light blocking layer BM may be omitted from the opening area OP to secure the transmittance of the opening area OP. For example, the light blocking layer BM may include an opening overlapping the opening area OP, and the opening of the light blocking layer BM may serve as a transmission window through which an object or a background positioned on one side of the display panel PNL may be visually recognized by a user on another side together with the opening area OP.

In FIG. 8, a case where the light blocking layer BM is disposed between the seventh insulating layer IL7 and the first common electrode CE1 is illustrated, but the disposition of the light blocking layer BM is not limited thereto. For example, a position of the light blocking layer BM may be variously modified within a range capable of minimizing the interference of the light between the first light emitting element LD1 and the second light emitting element LD2.

Figure 9:
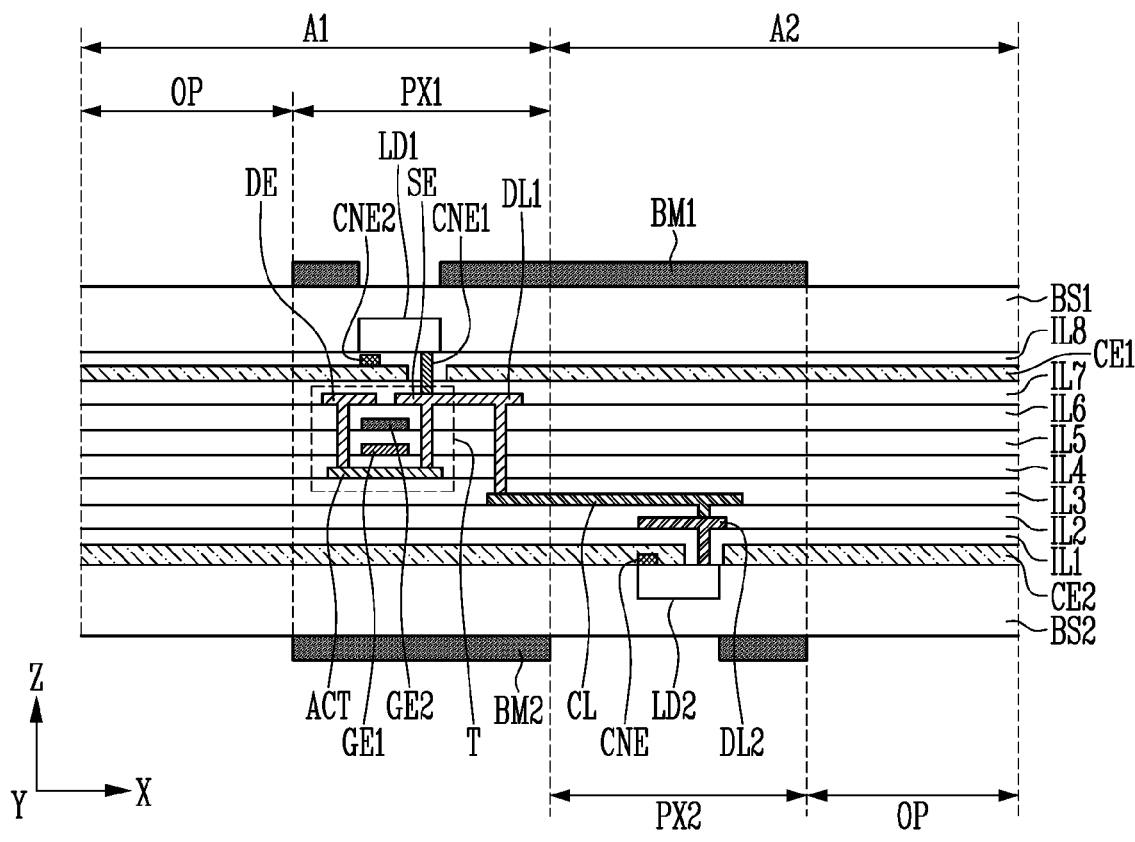
FIG. 9 is a schematic cross-sectional view of a display device according to yet another embodiment.

FIG. 9 is a schematic cross-sectional view of a display device according to still another embodiment.

Referring to FIG. 9, the display device according to the embodiment is different from the embodiment of FIGS. 1 to 6 in that the display device according to the embodiment further includes a first light blocking layer BM1 disposed on the first base layer BS1 and the second light blocking layer BM2 disposed on the second base layer BS2. In FIG. 9, for convenience of description, only the second pixel PX2 of the second area A2 which is symmetrical and electrically connected to the first pixel PX1 of the first area A1 is shown. However, separately driven pixels may be further disposed as described above.

The first light blocking layer BM1 and the second light blocking layer BM2 may serve to block reflection of external light. The first light blocking layer BM1 and the second light blocking layer BM2 may not overlap the first light emitting element LD1 and/or the second light emitting element LD2 in the third direction (for example, a Z-axis direction). For example, the first light blocking layer BM1 may include an opening exposing a surface of the first light emitting element LD1. The opening of the first light blocking layer BM1 may provide a path through which the light emitted from the first light emitting element LD1 is emitted to the first display surface S1. The second light blocking layer BM2 may include an opening exposing a surface of the second light emitting element LD2. The opening of the second light blocking layer BM2 may provide a path through which the light emitted from the second light emitting element LD2 is emitted to the second display surface S2.

According to an embodiment, the first and second light blocking layers BM1 and BM2 may be omitted from the opening area OP to secure the transmittance of the opening area OP. For example, the first and second light blocking layers BM1 and BM2 may include an opening overlapping the opening area OP, and the opening of the first and second light blocking layers BM1 and BM2 may serve as a transmission window through which an object or a background positioned on one side of the display panel PNL may be visually recognized by a user on another side together with the opening area OP.

Figure 10:
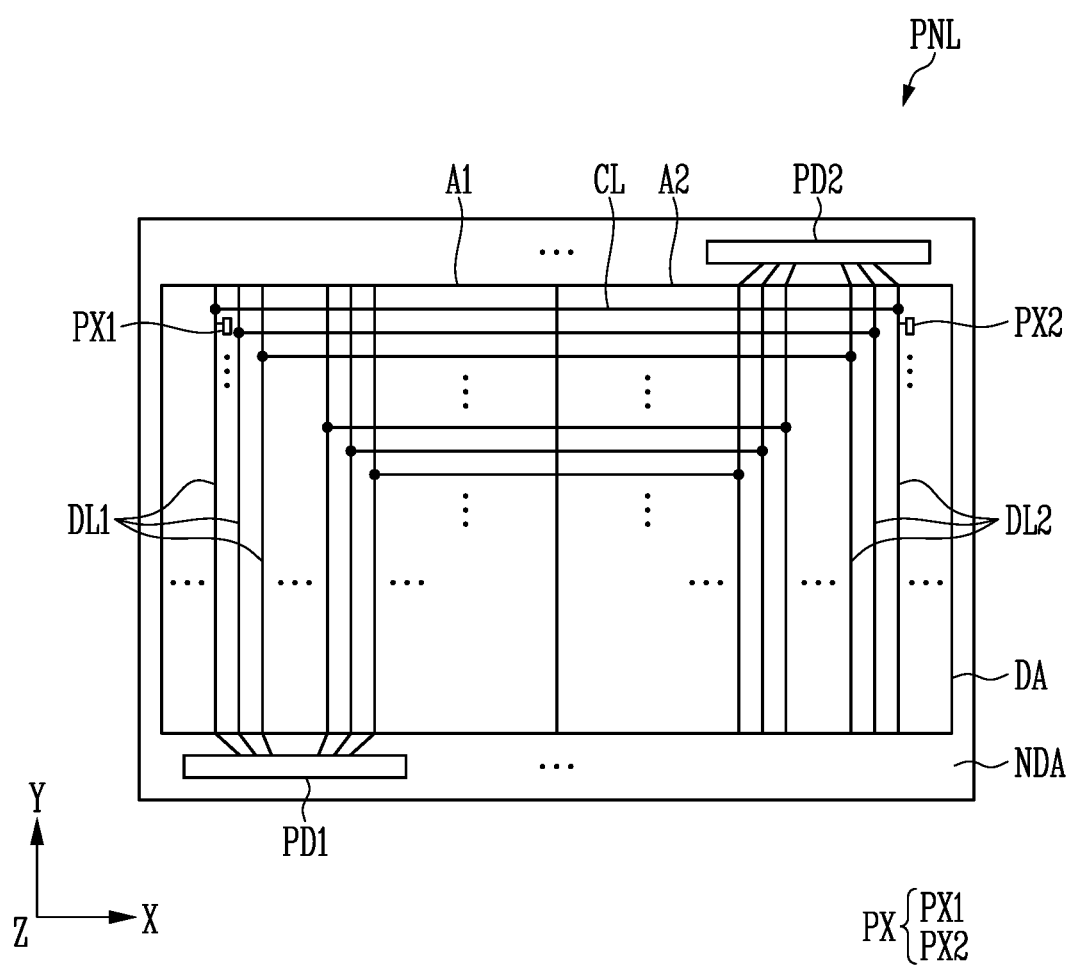
FIG. 10 is a plan view of a display device according to yet another embodiment.
Figure 11:
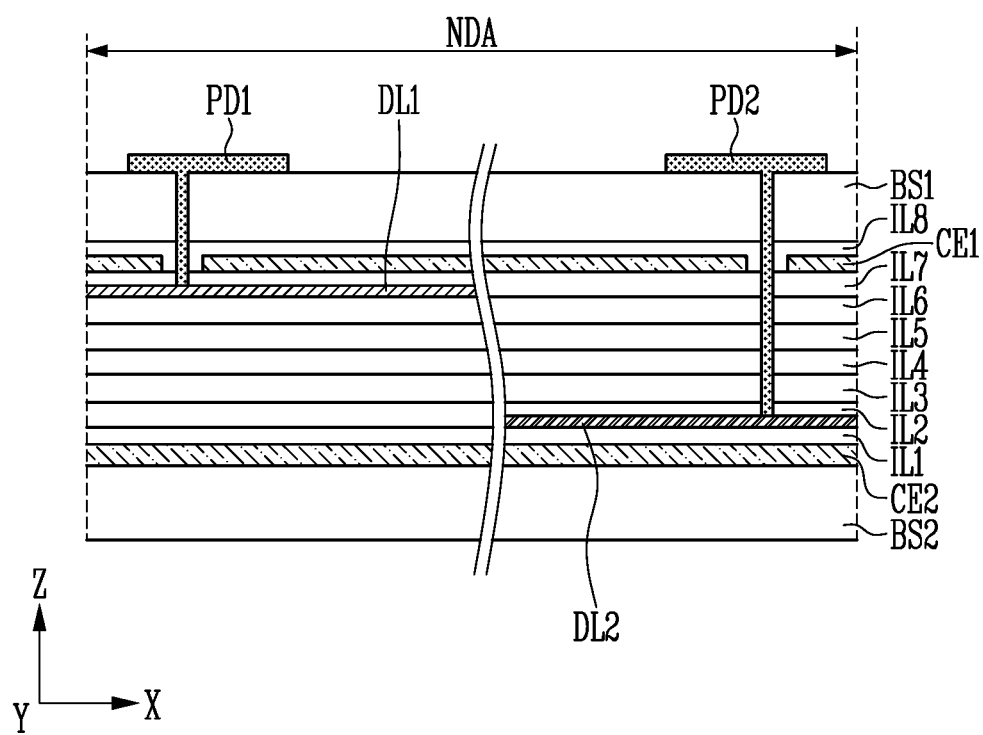
FIGS. 11 and 12 are schematic cross-sectional views of the display device according to another embodiment.
Figure 12:
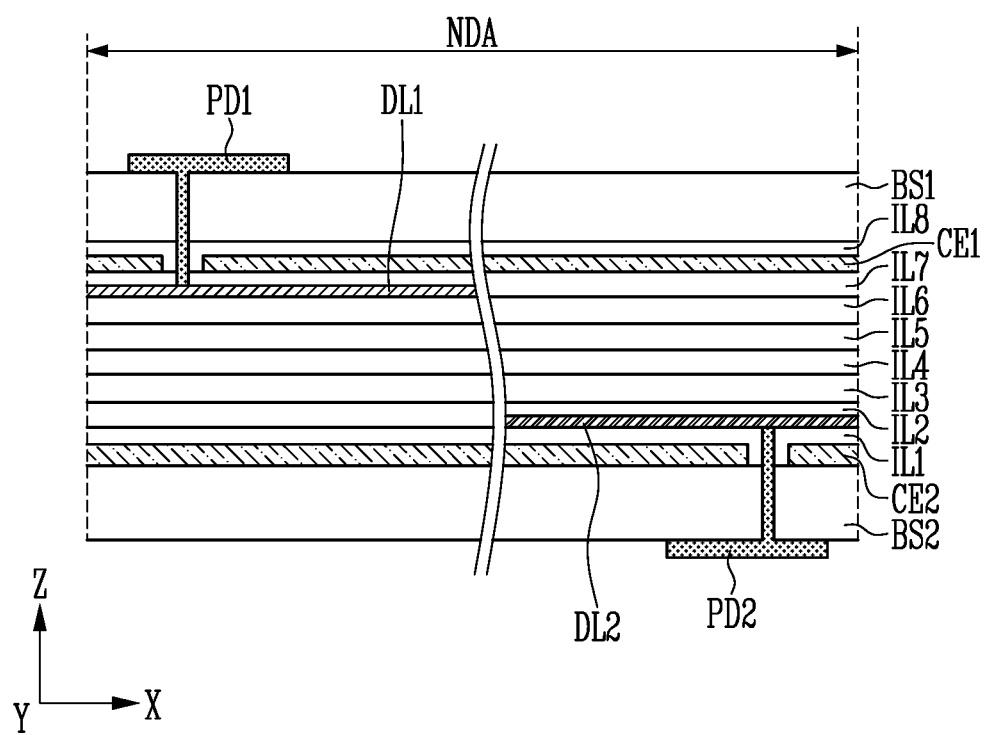

FIG. 10 is a plan view of a display device according to still another embodiment. FIGS. 11 and 12 are schematic cross-sectional views of the display device according to still another display device. FIGS. 11 and 12 illustrate cross-sections of a non-display area of the display device.

Referring to FIG. 10, the display device according to the embodiment is different from the embodiment of FIGS. 1 to 6 in that the display device according to the embodiment includes a first pad portion PD1 disposed on a side of the non-display area NDA and a second pad portion PD2 disposed on another side of the non-display area NDA.

The first pad portion PD1 may be electrically connected to the first signal lines DL1 and the second pad portion PD2 may be electrically connected to the second signal lines DL2.

The first pad portion PD1 may provide a first driving signal output from a first driver (not shown) to the first pixels PX1 through the first signal lines DL1. The second pad portion PD2 may provide a second driving signal output from the second driver (not shown) to the second pixels PX2 through the second signal lines DL2. For example, the first driver and the second driver may generate a data signal that determines the emission luminance of the first pixels PX1 and the second pixels PX2. A signal applied from the first driver to the first pixel PX1 may be the same as a signal applied from the second driver to the second pixel PX2 disposed at a position symmetrical with the first pixel PX1. For example, the first pixel PX1 and the second pixel PX2 respectively disposed at symmetrical positions on the first display surface S1 (or the front surface) and the second display surface S2 (or the rear surface) may be driven by a same signal. As described above, when the first and second pad portions PD1 and PD2 are provided on a side and another side of the display panel PNL to simultaneously provide driving signals to the pixels PX from the both sides of the display panel PNL, even though the first and second signal lines DL1 and DL2, which are front and rear data lines, are electrically connected through the connection line CL, a delay of the data signal due to a resistance increase may be alleviated. In FIG. 10, a case where the first pad portion PD1 is disposed under the display area DA and the second pad portion PD2 is disposed above the display area DA is illustrated, but positions of the first and second pad portions PD1 and PD2 are not limited thereto.

Referring to FIG. 11, the first pad portion PD1 and the second pad portion PD2 may be disposed on a same surface of the display panel PNL. For example, the first pad portion PD1 and the second pad portion PD2 may be disposed on a surface of the first base layer BS1. The first pad portion PD1 may be electrically connected to the first signal line DL1 through a contact hole passing through the first base layer BS1, the eighth insulating layer IL8, and/or the seventh insulating layer IL7. The second pad portion PD2 may be electrically connected to the second signal line DL2 through a contact hole passing through the first base layer BS1 and/or the second to eighth insulating layers IL2 to IL8.

In FIG. 11, a case where the first pad portion PD1 and the second pad portion PD2 are disposed on a surface of the first base layer BS1 is shown, but the disclosure is not limited thereto. For example, according to an embodiment, the first pad portion PD1 and the second pad portion PD2 may be disposed on a surface of the second base layer BS2. In FIG. 11, a case where the first pad portion PD1 and the second pad portion PD2 are disposed on a same surface of the display panel PNL is shown, but the disclosure is not limited thereto.

Referring to FIG. 12, the first pad portion PD1 may be disposed on a surface of the first base layer BS1, and the second pad portion PD2 may be disposed on a surface of the second base layer BS2. The first pad portion PD1 may be electrically connected to the first signal line DL1 through a contact hole passing through the first base layer BS1, the eighth insulating layer IL8, and/or the seventh insulating layer IL7. The second pad portion PD2 may be electrically connected to the second signal line DL2 through a contact hole passing through the second base layer BS2 and/or the first insulating layer IL1.

In FIG. 12, a case where the first pad portion PD1 is disposed on a surface of the first base layer BS1 and the second pad portion PD2 is disposed on a surface of the second base layer BS2 is illustrated, but the disclosure is not limited thereto. For example, according to an embodiment, the first pad portion PD1 may be disposed on a surface of the second base layer BS2, and the second pad portion PD2 may be disposed on a surface of the first base layer BS1.

The first pixel PX1 and the second pixel PX2 respectively disposed at symmetrical positions on the first display surface S1 (or the front surface) and the second display surface S2 (or the rear surface) of the display device may be simultaneously driven by the connection line CL, and thus the both-sided display panel PNL capable of displaying a same screen in which the left and right are not reversed may be implemented as described above.

Those skilled in the art may understand that the disclosure may be implemented in a modified form without departing from the above-described essential characteristic. Therefore, the disclosed methods should be considered as a description point of view, rather than as a limitation point of view. The scope of the disclosure is shown in the claims not in the above description, and all differences within the scope will be construed as being included in the disclosure.

What is claimed is:
1. A display device comprising:
a display panel including a first area, and a second area spaced apart from the first area in a plan view, the display panel further including a front major surface on a front side and a rear major surface opposite the front major surface on an opposing rear side of the display device, wherein the display panel comprises:
a first base layer including a first pixel, the first pixel producing a first image on the front major surface that is viewable from the front side of the display device;
a second base layer facing the first base layer and including a second pixel, the second pixel producing a second image on the rear major surface that is viewable from the rear side of the display device;
a first signal line electrically connected to the first pixel of the first area;
a second signal line electrically connected to the second pixel of the second area; and
a connection line electrically connecting the first signal line and the second signal line, the connection line being disposed between the first base layer and the second base layer, wherein
the connection line allows the second image to be produced simultaneously with that of the first image on the opposing sides of the display device with left and right portions of each of the images not being reversed.

2. The display device according to claim 1, wherein the first area and the second area are symmetrical on the display panel, the first pixel and the second pixel being disposed at symmetrical locations on the front major surface and rear major surface respectively so that a same image can be viewed from the rear side of the display device on the rear major surface as is viewed from a front side of the display device on the front major surface.

3. The display device according to claim 1, wherein the connection line is disposed between the first signal line and the second signal line in a cross-sectional view, the connection line being reflective to prevent the second image from being viewed on the front major surface from the front side of the display device.

4. The display device according to claim 1, wherein
an end of the connection line electrically contacts the first signal line in the first area, and
another end of the connection line electrically contacts the second signal line in the second area.

5. The display device according to claim 1, wherein
the first pixel includes a first light emitting element disposed on the first base layer, and
the second pixel includes a second light emitting element disposed on the second base layer.

6. The display device according to claim 5, further comprising:
a first common electrode disposed between the first light emitting element and the first signal line.

7. The display device according to claim 6, wherein
a side of the first light emitting element is electrically connected to the first signal line, and another side of the first light emitting element is electrically connected to the first common electrode.

8. The display device according to claim 7, wherein the first light emitting element is electrically connected to the first signal line through a contact hole passing through the first common electrode.

9. The display device according to claim 5, further comprising:
a second common electrode disposed between the second light emitting element and the second signal line.

10. The display device according to claim 9, wherein
a side of the second light emitting element is electrically connected to the second signal line, and
another side of the second light emitting element is electrically connected to the second common electrode.

11. The display device according to claim 10, wherein the second signal line is electrically connected to the second light emitting element through a contact hole passing through the second common electrode.

12. The display device according to claim 5, wherein
a surface of the first light emitting element is covered by the first base layer, and
a surface of the second light emitting element is covered by the second base layer.

13. The display device according to claim 5, further comprising:
a light blocking layer disposed between the first light emitting element and the second light emitting element.

14. A display device comprising:
a display panel including a first area, and a second area spaced apart from the first area in a plan view, the display panel further including a front major surface on a front side and a rear major surface opposite the front major surface on an opposing rear side of the display device, wherein the display panel comprises:
a first base layer including a first pixel, the first pixel producing a first image on the front major surface that is viewable from the front side of the display device;
a second base layer facing the first base layer and including a second pixel, the second pixel producing a second image on the rear major surface that is viewable from the rear side of the display device;
a first signal line electrically connected to the first pixel of the first area;
a second signal line electrically connected to the second pixel of the second area;
a connection line electrically connecting the first signal line and the second signal line, the connection line being disposed between the first base layer and the second base layer; and
an opening area that does not overlap the first pixel and the second pixel, the opening area being transmissive to allow a viewer on one side of the display device to view an object or background on an opposing side of the display device through the display device.

15. The display device according to claim 14, wherein the first base layer directly contacts the second base layer in the opening area.

16. The display device according to claim 14, further comprising a light blocking layer that does not overlap the opening area, wherein
the first area and the second area are symmetrical with respect to a center line disposed at a center of the display panel, and
the connection line intersects the center line.

17. The display device according to claim 16, wherein the light blocking layer comprises:
a first light blocking layer disposed on the first base layer; and
a second light blocking layer disposed on the second base layer.

18. The display device according to claim 1, further comprising:
a first pad portion disposed on the first base layer; and
a second pad portion disposed on the second base layer, wherein
the first pad portion is electrically connected to the first signal line, and
the second pad portion is electrically connected to the second signal line.

19. The display device according to claim 1, further comprising:
a first pad portion and a second pad portion disposed on the first base layer, wherein
the first pad portion is electrically connected to the first signal line, and
the second pad portion is electrically connected to the second signal line.

20. The display device according to claim 1, wherein
the first area and the second area are symmetrical with respect to a center line disposed at a center of the display panel, and
the connection line intersects the center line.

21. The display device according to claim 1, wherein each of the first direction and the second direction are orthogonal to a thickness direction of the display device.

22. The display device according to claim 14, wherein
the first area and the second area are symmetrical with respect to a center line disposed at a center of the display panel, and
the connection line intersects the center line.

23. The display device according to claim 1, wherein
the connection line extends in a first direction, and
the first signal line and the second signal line extend in a second direction intersecting the first direction.

* * * * *